United States Patent [19]

Hirooka et al.

[11] Patent Number: 4,657,777
[45] Date of Patent: Apr. 14, 1987

[54] FORMATION OF DEPOSITED FILM

[75] Inventors: Masaaki Hirooka, Toride; Shunichi Ishihara, Ebina; Junichi Hanna; Isamu Shimizu, both of Yokohama, all of Japan

[73] Assignee: Canon Kabushiki Kaisha, Tokyo, Japan

[21] Appl. No.: 821,134

[22] Filed: Jan. 22, 1986

Related U.S. Application Data

[63] Continuation of Ser. No. 682,367, Dec. 17, 1984, abandoned.

[51] Int. Cl.$^4$ .............................................. B05D 3/06
[52] U.S. Cl. ......................................... 427/39; 427/38
[58] Field of Search ...................................... 427/38, 39

[56] References Cited

U.S. PATENT DOCUMENTS 4,217,374  8/1980  Ovshinsky et al. ................... 427/39
4,226,898 10/1980  Ovshinsky ............................. 427/39

Primary Examiner—Bernard D. Pianalto
Attorney, Agent, or Firm—Fitzpatrick, Cella, Harper & Scinto

[57] ABSTRACT

A method for forming a deposited film is provided which comprises forming a gas atmosphere containing an active species (a) obtained by decomposition of a silicon halide represented by the formula $Si_nX_{2n+2}$ (n is an integer of 1 or more and X represents a halogen atom) and at least one compound selected from the group of the compounds (A) consisting of acyclic silanes, silanes having cyclic structures, silanes containing an alkyl group and halo-substituted derivatives thereof in a film forming space (A) where a silicon-containing film is to be formed on a desired substrate, and then carrying out at least one of (1) exciting discharging in said gas atmosphere and (2) giving heat energy to said gas atmosphere, thereby forming a silicon-containing deposited film.

23 Claims, 3 Drawing Figures

FORMATION OF DEPOSITED FILM

This application is a continuation of application Ser. No. 682,367 filed Dec. 17, 1984, abandoned.

BACKGROUND OF THE INVENTION

1. Field of the Invention

This invention relates to a method for forming a functional film, particularly a deposited film which is useful for semiconductor devices or photosensitive devices for electrophotography.

2. Description of the Prior Art

For formation of a silicon-containing deposited film such as a hydrogenated, halogenated or halo-containing hydrogenated amorphous silicon film (these are referred to comprehensively hereinafter as "a-Si(H,X)") or a polycrystalline silicon film, there have been attempted the vacuum deposition method, the plasma CVD method, the CVD method, the reactive sputtering method, the ion plating method and the optical CVD method. Among them, the plasma CVD have been generally employed and practiced in industry.

However, silicon-containing deposited films are further required to be improved in overall characteristics, with respect to electrical and optical characteristics, fatigue characteristics in repeated uses or environmental characteristics, and further productivity and bulk production, including uniformity and reproducibility.

The reaction process in formation of a-Si(H,X) deposited films according to the generally practiced plasma CVD method is considerably more complicated as compared with the CVD method of the prior art, and its mechanism has not been completely elucidated. There are a number of parameters for formation of the deposited film (e.g. substrate temperature flow rates and ratios of gases introduced, pressure during formation, high frequency power, electrode structure, structure of reaction vessel, evacuation speed, plasma generation system, etc.) and formation depends on a large number of these parameters. Accordingly, the plasma may sometimes become unstable, whereby marked deleterious effects have not scarecely been incurred on the deposited film. Moreover, the parameters inherent in the device must be chosen individually for respective devices and therefore the preparation conditions can be generalized with difficulty under the present situation.

On the other hand, in order to have a silicon-containing deposited film capable of exhibiting electrical and optical characteristics which can satisfy sufficiently the respective uses, it is now accepted as the best to form the deposited film according to the plasma CVD method.

However, depending on the uses for which the silicon-containing deposited film is applied, it is required to effect bulk production with good reproducibility, while satisfying fully enlargement of area, uniformity of film thickness and uniformity of film quality. For this reason, in formation of the silicon-containing deposited film according to the plasma CVD method, an enormous amount of installation investment becomes necessary for bulk production device, and items for controlling such production will become also increased in number and tolerance in control will also become narrower, requring also a severe control of the device. These points have been pointed out as the problems to be improved. On the other hand, in the prior art technique according to the thermal CVD method, a high temperature is required and no deposited film having practically useful characteristics has been obtained.

As described above, in formation of a silicon-containing deposited film, it has been earnestly desired to develop a method for forming films suitable for bulk production at low cost with keeping practically useful characteristics and uniformity. The same is true with other functional films such as silicon nitride film, silicon carbide film, silicon oxide film, etc.

SUMMARY OF THE INVENTION

An object of the present invention is to provide a novel method for forming a deposited film, which cancels the problems of the prior art as described above and does not follow the formation methods of the prior art.

Another object of the present invention is to accomplish simplification in management of film forming conditions and bulk production, by improving the deposition speed while enabling film formation at lower energy than the method of formation of the deposited film by use of the plasma reaction of the prior art in the space (A) for forming the deposited film and at the same time maintaining the characteristics of the film formed.

Still another object of the present invention is to provide a method for forming a deposited film, which comprises forming a gas atmosphere containing an active species (a) obtained by decomposition of a silicon halide represented by the formula $Si_nX_{2n+2}$ (n is an integer of 1 or more and X represents a halogen atom) and at least one compound selected from the group consisting of acyclic silanes, silanes having cyclic structures, silanes containing an alkyl group and halo-substituted derivatives thereof (hereinafter written as "Compound (A)") in a film forming space (A) where a silicon-containing film is to be formed on a desired substrate, and then carrying out at least one of (1) exciting discharging in said gas atmosphere and (2) giving heat energy to said gas atmosphere, thereby forming a silicon-containing deposited film.

DETAILED DESCRIPTION OF THE PREFERRED EMBODIMENTS

Figure 1:
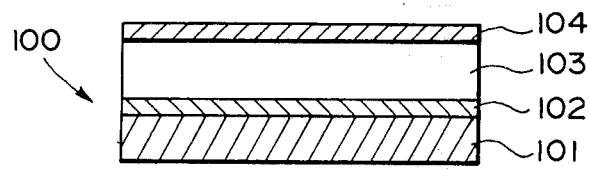
FIG. 1 represents a schematic illuatration of the layer structure for illustration of an embodiment of the photoconductive member prepared by use of the method of the present invention.

A difference of the method of the present invention from the CVD method and the plasma CVD method of the prior art lies in use of an active species (a) activated previously in other space than the space (A) for formation of deposited film. By doing so, the deposition can dramatically be accelerated as compared with the CVD method or the plasma CVD method of the prior art. In addition, the substrate temperature during formation of the deposited film can be lowered, whereby the deposited film of stable film quality can be provided industrially in a large amount and low cost.

Further, when the Compound (A) selected from among acyclic silanes, silanes having cyclic structures, silanes containing alkyl group and halo-substituted derivatives of these is decomposed by the discharging energy and or heat energy into active species (b) in the space (A) for formation of the deposited film, decomposition velocity can be greatly increased and decomposition can also be effected at a lower energy. Also, as compared with the prior art, the deposition velocity in forming a deposited film can be increased to a great extent.

In the present invention, $Si_nX_{2n+2}$ and the compound (A) which can effectively be used in the present invention may include the specific compounds as set forth below.

(1) $Si_nX_{2n+2}$ $SiF_4$, $Si_2F_6$, $Si_3F_8$, $Si_4F_{10}$, $Si_2Cl_6$, $SiF_2Cl_2$, $Si_2F_4Cl_2$, $SiBr_2F_2$ (2) Compound (A)

(a) acyclic silanes: $SiH_4$, $Si_2H_6$, $Si_3H_8$, $Si_4H_{10}$, $SiH_3SiH(SiH_3)SiH_3$
(b) halogenated acyclic silanes:
$SiH_2Cl_2$, $SiH_3Cl$, $Si_2H_4Cl_2$, $SiH_3H_6Cl_2$
(c) cyclic cilanes: $Si_3H_6$, $Si_5H_{10}$, $Si_6H_{12}$, $Si_5H_9(SiH_3)$, $Si_6H_{11}(SiH_3)$
(d) halogenated cyclic silanes: $Si_5H_5Cl_5$, $Si_5H_5Br_5$, $Si_5H_5Cl_3Br_2$, $Si_5H_6Cl_4$, $Si_6H_8Cl_4$, $Si_5H_6Br_4$, $Si_5H_6Cl_2Br_2$
(e) alkyl-containing silanes: $SiH_2(CH_3)_2$, $SiH_3Si(CH_3)_3$, $SiH_3SiH_2Si(CH_3)_3$, $SiH_3SiH_2SiH_2Si(CH_3)_3$, $Si_5H_9(CH_3)$, $SiH_2(OCH_3)SiH_2Si(CH_3)_3$, $SiH_2(C_6H_5)Si(CH_3)_3$
(f) alkyl-containing halogenated silanes: $SiH_2ClSiH_2Si(CH_3)_3$, $SiH_2BrSi(CH_3)_3$, $SiH_2(OCH_3)SiH_2Si(CH_3)_2SiClH_2$ In the present invention, among the specific compounds (A) as mentioned above, for the purpose of attaining the objects more effectively, namely to ensure high quality of the film and realizing low energy high speed formation of the film with good efficiency, it is desirable to use at least one of the compounds having an even number of hydrogen atoms.

In the method for forming deposited film of the present invention, the compound represented by the general formula $Si_nX_{2n+2}$ is activated previously in a separate space [space (B) for formation of active species] before introduced into the space (A) for film formation by a desired energy, and then introduced under active state into the space (A) for film formation, whereby, for example, a halo-containing silicon deposited film having excellent electrical and photoelectric characteristics can be formed which has been deemed to be difficult to form in the production on an industrial base.

In the present invention, the decomposition energy given to the compound $Si_nX_{2n+2}$ in the space (B) for forming active species may include heat, light, discharging, etc. and these decomposition energies may be chosen suitably depending on the decomposition characteristics of the compound $Si_nX_{2n+2}$ to be employed.

In the present invention, the active species (a) to be introduced into the deposition space (A) from the decomposition space (B) should desirably have a life of several seconds or more, and a desired device is to be designed in view of this life. In the present invention, the constituent element of this active species (a) is one of the components constituting the deposited film to be formed in the deposition space (A).

As the active species (a) to be utilized in the present invention, it is desirable to use one having its active life preferably of several seconds or more as mentioned above, more preferably of 5 to 6 seconds, from the view point that the active species (a), when introduced into the film forming space (A), may raise the decomposition efficiency and accelerate the decomposition reaction of compound (A) simultaneously introduced there.

From such a point of view, the compound represented by the general formula $Si_nX_{2n+2}$ should preferably be one which produces an active species of $SiF_2^*$.

The ratio of the amount of the active species (a) to be introduced from the space (B) for formation of active species to the Compound (A) introduced in the deposited film forming space (A) in the present invention may be determined suitably as desired depending on the deposition conditions, the active species (A) employed, etc., but may be suitably within the range of from 100:1 to 1:10 (flow rate ratio of introduction), more preferably from 20:1 to 1:1.

As can be seen from the above description and the Examples shown later, according to the method of the present invention, it is possible to form a deposited film with lower energy consumption in the deposition film forming space (A) for formation of a desired silicon-containing deposited film as compared with the prior art method, and due to no utilization of discharging, disturbance of discharging or damage on the film surface, etc., which have been the problems in the plasma CVD utilizing discharging of the prior art, can markedly be suppressed. On the other hand, also as compared with the hot CVD method of the prior art, film formation may be possible at lower temperature region, and high film quality can be ensured simultaneously with film formation at high deposition speed.

Further, the parameters for formation of deposited film are fewer as compared with the prior art, such as the amount of active species introduced, the temperatures of the substrate and the deposited film forming space and the inner pressure in the deposited film forming space, and therefore formation of deposited film can easily be controlled. Thus, the present method is a method for formation of deposited film with reproducibility and bulk productivity.

Referring now to a typical example of an image forming member for electrophotography formed according to the deposited film preparation method of the present invention, the present invnetion is described in detail.

FIG. 1 shows a schematic drawing for illustration of a typical example of the constitution of the photoconductive member obtained by the present invention.

The photoconductive member 100 shown in FIG. 1 is applicable as an image forming member for electrophotography and has a layer structure consisting of a photoconductive layer 103, an intermediate layer 102, which may optionally be provided, and a surface layer 104 provided on a substrate 101 for a photoconductive member The substrate 101 to be used in the present invention may be either electroconductive or insulating. As the electroconductive material, there may be mentioned metals such as NiCr, stainless steel, Al, Cr, Mo, Au, Ir, Nb, Ta, V, Ti, Pt, Pd etc. or alloys thereof.

As the insulating substrate, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. Such an insulating substrate should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying.

The intermediate layer 102 may be constituted of, for example, a non-photoconductive amorphous material containing silicon atoms and carbon atoms or nitrogen atoms or oxygen atoms, or halogen atoms (X), and has the function of impeding effectively inflow of carriers from the substrate 101 side into the photoconductive layer 103, and permitting easy passage of the photocarriers, which are generated in the photoconductive layer 103 by irradiation of an electromagnetic wave and migrate toward the substrate 101 side, from the side of the photoconductive layer 103 to the side of the substrate 101.

In the case of a photoconductive member having an intermediate layer 102 provided thereon, subsequent to formation of the intermediate layer 102, formation of the photoconductive member 103 can also be conducted continuously following the method of the present invention. In such a case, first a starting material (SM) for formation of the intermediate layer other than the aforesaid $Si_nX_{2n+2}$ and Compound (A), optionally mixed at a desired mixing ratio with a diluting gas such as He, Ar, etc., may be introduced into a vacuum deposition chamber for film forming space (A), in which a substrate is placed, together with active species (a) formed from $Si_nX_{2n+2}$ and Compound (A), followed by action of heat and/or discharging energy, to form an intermediate layer 102 on the above-mentioned substrate 101.

The effective starting materials (SM) to be introduced into the film forming space (A) for formation of the intermediate layer 102 may include nitrogen, nitrogen compounds such as nitrides and azides, containing N or N and H as constituent atoms, for example, nitrogen ($N_2$), ammonia ($NH_3$), hydrazine ($H_2NNH_2$), hydrogen azide ($HN_3$), ammonium azide ($NH_4N_3$), etc.; hydrocarbons containing C and H as constituent atoms, for example, saturated hydrocarbons having 1 to 5 carbon atoms, ethylenic hydrocarbons having 2 to 5 carbon atoms and acetylenic hydrocarbons having 2 to 4 carbon atoms, more specifically, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methyl acetylene ($C_3H_8$), butyne ($C_4H_6$), etc.; and further, other than these, for example, oxygen ($O_2$), ozone ($O_3$), carbon monoxide (CO), carbon dioxide ($CO_2$), nitrogen monoxide (NO), nitrogen dioxide ($NO_2$), dinitrogen monoxide ($N_2O$), etc. These compounds may be used also as a mixture.

The starting material (SM) for formation of the intermediate layer 102 may be chosen suitably during layer formation so that the desired atoms may be contained as constituent atoms in the intermediate layer 102 formed.

The intermediate layer 102 may have a thickness preferably of 30 to $5 \times 10^4$ Å, more preferably 50 to $1 \times 10^4$ Å. The photoconductive layer 103, when formed according to the method of the present invention is constituted of an amorphous silicon a-Si(H,X) containing halogen atoms (X), optionally together with hydrogen atoms (H), in a matrix of silicon atoms so as to have a photoconductive characteristics so that the function as an image forming member for electrophotography may fully be exhibited. Formation of the photoconductive layer 103 can be done, similarly as the intermediate layer 102, by introducing a starting gas such as $SiF_4$, $Si_2F_6$, into an active species forming space (B), and decomposing these at a high temperature to form active species (a). The active species (a) is then introduced into the deposited film forming space (A). On the other hand, into the film forming space (A), a starting gas which contains Compound (A) such as $Si_2H_6$, $Si_3H_8$, etc. is introduced and given a certain excitation energy together with the previous active species (a) to be decomposed. This active species undergoes immediately chemical interaction with the active species (a) in the deposited film forming space (A) to form a photoconductive layer 103 having desired characteristics. The layer thickness of the photoconductive member 103 may be determined suitably as desired depending on the purpose of use to be applied.

The photoconductive member 103 shown in FIG. 1 may have a layer thickness, which should be determined suitably as desired depending on the layer thickness relationship with the intermediate layer 102 so that the function of the photoconductive layer 103 and the function of the intermediate layer 102 may respectively be exhibited effectively, and may preferably be in usual cases a layer thickness which is some hundred to some thousand times or more as thick as the layer thickness of the intermediate layer 102.

To be more specific, a value preferably of 10 to 100$\mu$, more preferably of 2 to 50$\mu$, may be desirable.

The content of H or X (X represents a halogen atom such as F) contained in the photoconductive layer 103 in the photoconductive member shown in FIG. 1 may preferably be 1 to 40 atomic %, more preferably 5 to 30 atomic %.

The surface layer 104 of the photoconductive member shown in FIG. 1 may be formed in a similar way to the intermediate layer and the photoconductive layer 103, if necessary. For example, if the surface layer 104 is a silicon carbide film, $SiF_4$ may be introduced into the active species forming space (B), and a starting gas such as of $Si_2H_6$ and $H_2$, or $Si_2H_6$ and $Si_2(CH_3)_2$ introduced into the deposited film forming space (A), followed by excitation of $SiF_4$ by exitation energy in the active species forming space (B) to form active species (a), which are in turn introduced into the film forming space (A) and discharging is effected or heat is given to form a surface layer 104. As the surface layer 104, a deposited film with a wide band gap such as a silicon nitride or silicon oxide film is preferred, and it is also possible to change continuously the film formation from the photoconductive layer 103 to the surface layer 104. The surface layer 104 should preferably have a layer thickness of 0.01μ to 5μ, more preferably 0.05μ to 1μ.

The photoconductive layer 103 can be made either n-type or p-type, if desired, by doping an n-type impurity or a p-type impurity or both impurities into the layer to be formed during layer formation, while controlling its amount.

As the impurity to be doped into the photoconductive layer, the p-type impurity may include preferably the group III A elements of the periodic table, for example, B, Al, Ga, In, Tl, etc., while the n-type impurity may include preferably the group V A elements of the periodic table, for example, N, P, As, Sb, Bi, etc., particularly preferably B, Ga, P and Sb.

The content of the impurity to be doped into the photoconductive layer 103 in order to give a desired conduction type in the present invention may be determined suitably depending on the desired electrical and optical characteristics, but preferably in the range of $3 \times 10^{-2}$ atomic % or less in the case of the impurity of the group III A of the periodic table, or in the range of $5 \times 10^{-3}$ atomic % in the case of the impurity of group V A of the periodic table.

For doping of an impurity into the photoconductive layer 103, a starting material for introduction of an impurity may be introduced into the film forming space (A) or the active species forming space (B) or both spaces in a gaseous state during layer formation. It is more preferable to introduce the starting material into the film forming space (A) rather than into the active species forming space (B). As the starting material for introduction of such an impurity, there may be employed compounds which are gaseous under normal temperature and normal pressure or readily gasifiable at least under layer forming conditions.

Typical examples of starting materials for introduction of such impurities may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$ and the like.

EXAMPLE 1

By means of the device shown in FIG. 2, a drum-shaped image forming member for electrophotography was prepared according to the procedure as described below.

Figure 2:
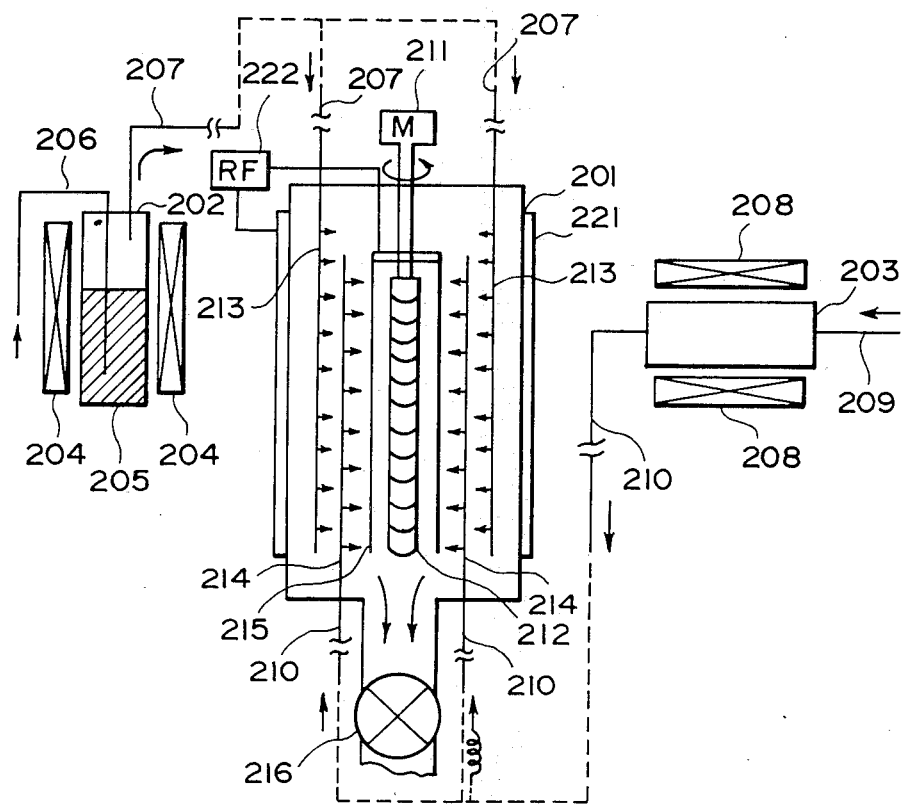
FIG. 2 and FIG. 3 each represent a schematic illustration of an example of the device for practicing the preparation method of the present invention.

In FIG. 2, 201 shows a deposited film forming space (A), 202 an active species forming space (B), 203 a preliminary space (C), 204 an electric furnace, 205 solid Si particles, 206 a feed pipe for SiF4, etc., 207 a feed pipe for active species, 208 an electric furnace for preliminary heating, 209 and 210 feed pipes for Compound (A), 211 a motor, 212 a heater, 213 and 214 blowing pipes, 215 an aluminum cylinder and 216 a vent valve.

In the deposited film forming space (A) 201, the aluminum cylinder 215 was hung with provision of the heater 212 innerside thereof, and made rotatable by the motor 211. The active species from the active species forming space (B) 202 was introduced via the feed pipe 207 through the blowing pipe 213 and the Compound (A) from the preliminary heating space (C) 203 via the feed pipe 210 through the blowing pipe 204 into the film forming space (A), respectively.

The active species forming space (B) 202 was packed with solid Si particles 205 and the particles Si were heated red by heating with the electric furnace 204 to be maintained 1100° C., and SiF4 gas was blown from the bomb through the feed pipe 206 into the active species forming space (B) to form active species such as $SiF_2^*$, which was in turn introduced into the film forming space (A) via the feed pipe 207 through the blowing pipe 213. On the other hand, SiH4 is introduced through the feed pipe 209 into the preliminary heating space (C) 203, and then from the feed pipe 210 into the blowing pipe 214. The length of the feed pipe 207 was made as short as possible so as not to lower the effective efficiency of the active species. The aluminum cylinder in the deposited film forming space (A) was heated to 270° C. by the heater 212 and maintained thereat, while it was rotated. The discharged gas was vented through the vent valve 216. Ten samples having thus formed photoconductive layers on aluminum cylinders were prepared, and solid black toner images were formed on A4 size transfer papers by use of respective sample drums according to Carlson Process. Image defects (white dots) were counted to measure average image defects per 10 lines. Separately, for respective samples, the acceptance potential irregularities were measured in a conventional manner along the circumferential direction and the generatrix direction of the drum.

These results are shown in Table 1A.

EXAMPLES 2 TO 9

Following the same preparation conditions and procedures as described in Example 1A, except for using the conditions as shown in Table 1A and Table 2A, 10 samples were prepared for each Example, and evaluations were conducted similarly to those in Example 1.

The results are shown in Table 1A and Table 2A. Also Comparative examples 1 to 4 are shown in Table 3A.

EXAMPLE 10

By means of the device shown in FIG. 3, a drum-shaped image forming member for electrophotography was prepared according to the procedure as described below.

Figure 3:
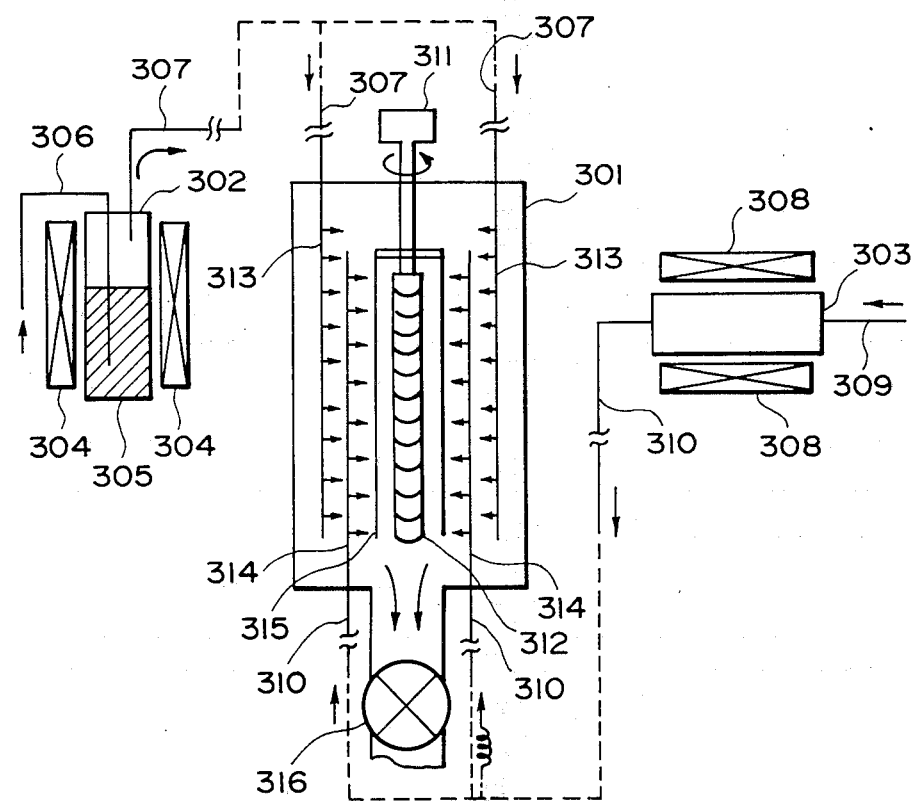

In FIG. 3, 301 shows a deposited film forming space (A), 302 an active species forming space (B), 303 a preliminary space (C), 304 an electric furnace, 305 solid Si particles, 306 a feed pipe for SiF4, etc., 307 a feed pipe for active species, 308 an electric furnace for preliminary heating, 309 and 310 feed pipes for Compound (A), 311 a motor, 312 a heater, 313 and 314 blowing pipes, 315 an aluminum cylinder and 316 a vent valve.

In the deposited film forming space (A) 301, the aluminum cylinder 315 was hung with provision of the heater 312 innerside thereof, and made rotatable by the motor 311. The active species from the active species forming space (B) 302 was introduced via the feed pipe 307 through the blowing pipe 313 and the Compound (A) from the preliminary heating space (C) 303 via the feed pipe 310 through the blowing pipe 314 into the film forming space (A), respectively.

The active species forming space (B) 302 was packed with solid Si particles 305 and the particles Si were heated red by heating with the electric furnace 304 to be maintained 1100° C., and SiF4 gas was blown from the bomb through the feed pipe 306 into the active species forming space (B) to form active species such as $SiF_2^*$, which was in turn introduced into the film forming space (A) via the feed pipe 307 through the blowing pipe 313. On the other hand, SiH4 is introduced through the feed pipe 309 into the preliminary heating space (C) 303, and then from the feed pipe 310 into the blowing pipe 314. The length of the feed pipe 307 was made as short as possible so as not to lower the effective efficiency of the active species. The aluminum cylinder in the deposited film forming space (A) was heated to 270° C. by the heater 312 and maintained thereat, while it was rotated. The discharged gas was vented through the vent valve. Ten samples having thus formed photoconductive layers on aluminum cylinders were prepared, and solid black toner images were formed on A4 size transfer papers by use of respective sample drums according to Carlson Process. Image defects (white dots) were counted to measure average image defects per 10 lines. Separately, for respective samples, the acceptance potential irregularities were measured in a conventional manner along the circumferential direction and the generatrix direction of the drum.

These results are shown in Table 1B.

EXAMPLES 11 TO 17

Following the same preparation conditions and procedures as described in Example 10, except for using the conditions as shown in Table 1B and Table 3B, 10 samples were prepared for each Example, and evaluations were conducted similarly to in Example 10.

The results are shown in Table 1B and Table 2B. Also, Comparative examples 5 to 9 are shown in Table 3B.

TABLE 1A

| Item | | Example 1 | Example 2 | Example 3 | Example 4 | Example 5 |
|---|---|---|---|---|---|---|
| $Si_nX_{2n+2}$ | | $SiF_4$ | $SiF_4$ | $SiF_4$ | $SiF_4$ | $SiF_4$ |
| Decomposition temperature (°C.) | | 1,100 | 1,100 | 1,100 | 1,100 | 1,100 |
| Primary decomposed active species | | $SiF_2^*$ | $SiF_2^*$ | $SiF_2^*$ | $SiF_2^*$ | $SiF_2^*$ |
| Amount introduced (SCCM) | | 150 | 150 | 150 | 150 | 150 |
| Compound (A) | | $SiH_4$ | $Si_2H_6$ | $Si_5H_{10}$ | $SiH_4/Si_2H_6$ (Vol ratio 1/1) | $Si_2H_6/Si_5H_{10}$ (Vol ratio 1/1) |
| Amount introduced (SCCM) | | 150 | 80 | 60 | 100 | 80 |
| High frequency output (W) | | 60 | 40 | 40 | 40 | 40 |
| Inner pressure (Torr) | | 0.8 | 0.7 | 0.8 | 0.9 | 0.85 |
| Substrate temperature (°C.) | | 270 | 270 | 250 | 250 | 260 |
| Deposition velocity (Å/S) | | 15 | 25 | 41 | 24 | 32 |
| Layer thickness (μ) | | 21 | 20 | 23 | 22 | 20 |
| Average image defect (number/10 drums) | | 2 | 3 | 2 | 3 | 2 |
| Acceptance potential irregularity | Circumferential direction (V) | ±9 | ±12 | ±8 | ±11 | ±5 |
| | Generatrix direction (V) | ±11 | ±10 | ±11 | ±10 | ±6 |
| Remarks | | — | — | — | — | — |

TABLE 2A

| Item | | Example 6 | Example 7 | Example 8 | Example 9 |
|---|---|---|---|---|---|
| $Si_nX_{2n+2}$ | | $Si_2F_6$ | $Si_2F_4Cl_2$ | $Si_2F_6$ | $SiF_2Cl_2$ |
| Decomposition temperature (°C.) | | 800 | 750 | 800 | 1,000 |
| Primary decomposed active species | | $SiF_2^*$ | $SiF_2^*$ | $SiF_2^*$ | $SiF_2^*$ |
| Amount introduced (SCCM) | | 90 | 90 | 90 | 150 |
| Compound (A) | | $Si_3H_8$ | $Si_2H_6$ | $Si_2H_3Cl_3$ | $SiH_4/Si_5H_6Cl_4$ (Vol ratio 1/1) |
| Amount introduced (SCCM) | | 80 | 90 | 100 | 80 |
| High frequency output (W) | | 40 | 40 | 50 | 50 |
| Inner pressure (Torr) | | 0.9 | 0.75 | 0.9 | 0.8 |
| Substrate temperature (°C.) | | 270 | 250 | 280 | 280 |
| Deposition velocity (Å/S) | | 38 | 21 | 19 | 23 |
| Layer thickness (μ) | | 23 | 20 | 19 | 21 |
| Average image defect (number/10 drums) | | 2 | 3 | 2 | 3 |
| Acceptance potential irregularity | Circumferential direction (V) | ±10 | ±8 | ±9 | ±12 |
| | Generatrix direction (V) | ±10 | ±11 | ±7 | ±13 |
| Remarks | | — | — | — | — |

TABLE 3A

| Item | Comparative Example 6 | Comparative Example 7 | Comparative Example 8 | Comparative Example 9 |
|---|---|---|---|---|
| $Si_nX_{2n+2}$ | — | — | $SiF_4$ | — |
| Decomposition temperature (°C.) | | | 1,100 | |
| Primary decomposed active species | | | $SiF_2^*$ | |
| Amount introduced (SCCM) | | | 200 | |
| Compound (A) | $SiH_4$ | $SiF_4/SiH_4$ (Vol ratio 1/1) | $H_2$ | $SiF_4$ |
| Amount introduced (SCCM) | 300 | 300 | 100 | 200 |
| High frequency output (W) | 200 | 250 | 150 | 300 |
| Inner pressure (Torr) | 0.9 | 0.95 | 0.85 | 0.75 |
| Substrate temperature (°C.) | 270 | 280 | 270 | 280 |
| Deposition velocity (Å/S) | 7 | 5 | 8 | ~0 |

TABLE 3A-continued

| Item | | Comparative Example 6 | Comparative Example 7 | Comparative Example 8 | Comparative Example 9 |
|---|---|---|---|---|---|
| Layer thickness ($\mu$) | | 17 | 18 | 17 | 1 |
| Average image defect (number/10 drums) | | 12 | 10 | 13 | — |
| Acceptance potential irregularity | Circumferential direction (V) | ±28 | ±38 | ±21 | — |
| | Generatrix direction (V) | ±37 | ±29 | ±31 | — |
| Remarks | | Plasma CVD method of prior art | Plasma CVD method of prior art employing SiF$_4$ | Plasma CVD method employing H$_2$ | Plasma CVD method employing only SiF$_4$ |

TABLE 1B

| Item | | Example 10 | Example 11 | Example 12 | Example 13 | Example 14 |
|---|---|---|---|---|---|---|
| Si$_n$X$_{2n+2}$ | | SiF$_4$ | SiF$_4$ | SiF$_4$ | Si$_2$F$_6$ | Si$_2$F$_6$ |
| Decomposition temperature (°C.) | | 1,100 | 1,100 | 1,100 | 800 | 800 |
| Primary decomposed active species | | SiF$_2$* | SiF$_2$* | SiF$_2$* | SiF$_2$* | SiF$_2$* |
| Amount introduced (SCCM) | | 180 | 180 | 180 | 120 | 120 |
| Compound (A) | | Si$_2$H$_6$/Si$_3$H$_8$ (Vol ratio 1/1) | Si$_5$H$_{10}$ | H$_3$Si.Si(CH$_3$)$_3$ | Si$_2$H$_6$ | H$_3$Si.Si(CH$_3$)$_3$ |
| Amount introduced (SCCM) | | 60 | 50 | 100 | 60 | 100 |
| Decomposition temperature (°C.) | | 280 | 310 | 380 | 40 | 40 |
| Inner pressure (Torr) | | 2.5 | 3.1 | 3.0 | 1.8 | 2.3 |
| Substrate temperature (°C.) | | 290 | 320 | 380 | 330 | 380 |
| Deposition velocity (Å/S) | | 26 | 30 | 25 | 23 | 28 |
| Layer thickness ($\mu$) | | 19 | 18 | 20 | 22 | 21 |
| Average image defect (number/10 drums) | | 2 | 2 | 1 | 2 | 1 |
| Acceptance potential irregularity | Circumferential direction (V) | ±8 | ±6 | ±3 | ±8 | ±8 |
| | Generatrix direction (V) | ±7 | ±8 | ±5 | ±7 | ±8 |
| Remarks | | — | — | — | — | — |

TABLE 2B

| Item | | Example 15 | Example 16 | Example 17 |
|---|---|---|---|---|
| Si$_n$X$_{2n+2}$ | | SiF$_2$Cl$_2$ | Si$_2$F$_4$Cl$_2$ | Si$_2$F$_6$ |
| Decomposition temperature (°C.) | | 800 | 800 | 800 |
| Primary decomposed active species | | SiF$_2$* | SiF$_2$* | SiF$_2$* |
| Amount introduced (SCCM) | | 200 | 120 | 120 |
| Compound (A) | | Si$_2$H$_6$/SiH$_4$ (Vol ratio 1/1) | H$_3$Si.Si(CH$_3$)$_3$ | H$_2$Si(OCH$_3$)$_3$.Si(CH$_3$)$_3$ |
| Amount introduced (SCCM) | | 80 | 110 | 110 |
| Decomposition temperature (°C.) | | 320 | 380 | 350 |
| Inner pressure (Torr) | | 3.1 | 3.2 | 2.8 |
| Substrate temperature (°C.) | | 330 | 390 | 360 |
| Deposition velocity (Å/S) | | 22 | 21 | 25 |
| Layer thickness ($\mu$) | | 21 | 19 | 23 |
| Average image defect (number/10 drums) | | 2 | 3 | 1 |
| Acceptance potential irregularity | Circumferential direction (V) | ±9 | ±8 | ±10 |
| | Generatrix direction (V) | ±7 | ±9 | ±10 |
| Remarks | | — | — | — |

TABLE 3B

| Item | Comparative example 5 | Comparative example 6 | Comparative example 7 | Comparative example 8 | Comparative example 9 |
|---|---|---|---|---|---|
| Si$_n$X$_{2n+2}$ | SiF$_4$ | — | — | — | — |
| Decomposition temperature (°C.) | 1,100 | | | | |
| Primary decomposed active species | SiF$_2$* | | | | |
| Amount introduced (SCCM) | 250 | | | | |
| Compound (A) | H$_2$ | SiF$_4$/Si$_5$H$_{10}$ (Vol ratio 1/1) | Si$_2$H$_6$ | Si$_5$H$_{10}$ | SiF$_4$ |
| Amount introduced (SCCM) | 70 | 250 | 210 | 100 | 190 |
| Decomposition temperature (°C.) | 500 | 390 | 380 | 310 | 600 |

TABLE 3B-continued

| Item | | Example or Comparative example | | | | |
|---|---|---|---|---|---|---|
| | | Comparative example 5 | Comparative example 6 | Comparative example 7 | Comparative example 8 | Comparative example 9 |
| Inner pressure (Torr) | | 2.8 | 2.1 | 2.2 | 1.8 | 2.1 |
| Substrate temperature (°C.) | | 520 | 380 | 380 | 320 | 620 |
| Deposition velocity (Å/S) | | 5 | 9 | 8 | 12 | — |
| Layer thickness ($\mu$) | | 21 | 19 | 20 | 22 | — |
| Average image defect (number/10 drums) | | 9 | 3 | 2 | 3 | — |
| Acceptance potential irregularity | Circumferential direction (V) | ±25 | ±12 | ±10 | ±11 | — |
| | Generatrix direction (V) | ±32 | ±8 | ±12 | ±13 | — |
| Remarks | | Hot CVD method with $H_2$ | Hot CVD method of prior art | Hot CVD method of prior art | Hot CVD method of prior art | Hot CVD method of prior art |

What is claimed is:

1. A method for forming a deposited film, which comprises forming a gas atmosphere containing an active species (a) obtained by decomposition of a silicon halide represented by the formula $Si_nX_{2n+2}$ (n is an integer of 1 or more and X represents a halogen atom) and at least one compound selected from the group of the compounds (A) consisting of acyclic silanes, silanes having cyclic structures, silanes containing an alkyl group and halo-substituted derivatives thereof in a film forming space (A) where a silicon-containing film is to be formed on a desired substrate, and then carrying out at least one of (1) exciting discharging in said gas atmosphere and (2) giving heat energy to said gas atmosphere, thereby forming a silicon-containing deposited film.

2. A method according to claim 1, wherein the compound (A) is an acyclic silane.

3. A method according to claim 2, wherein the acyclic silane is selected from the group consisting of $SiH_4$, $Si_2H_6$, $Si_3H_8$, $Si_4H_{10}$ and $SiH_3SiH(SiH_3)SiH_3$.

4. A method according to claim 1, wherein the compound (A) has a cyclic structure.

5. A method according to claim 4, wherein the silane having a cyclic structure is selected from the group consisting of $Si_3H_6$, $Si_5H_{10}$, $Si_6H_{12}$, $Si_5H_9(SiH_3)$ and $Si_6H_{11}(SiH_3)$.

6. A method according to claim 1, wherein the compound (A) is a silane having an alkyl group.

7. A method according to claim 6, wherein the silane having an alkyl group is selected from the group consisting of $SiH_2(CH_3)_2$, $SiH_3Si(CH_3)_3$, $SiH_3SiH_2Si(CH_3)_3$, $SiH_3SiH_2SiH_2Si(CH_3)_3$, $Si_5H_9(CH_3)$, $SiH_2(OCH_3)SiH_2Si(CH_3)_3$, and $SiH_2(C_6H_5)Si(CH_3)_3$.

8. A method according to claim 1, wherein the compound A is a halo-substituted derivative of an acyclic silane.

9. A method according to claim 8, wherein the halo-substituted derivative of an acyclic silane is selected from the group consisting of $SiH_2Cl_2$, $SiH_3Cl$, $Si_2H_4Cl_2$ and $Si_3H_6Cl_2$.

10. A method according to claim 1, wherein the compound A is a halo-substituted derivative of a silane having a cyclic structure.

11. A method according to claim 10, wherein the halo-substituted derivative of a silane having a cyclic structure is selected from the group consisting of $Si_5H_5Cl_5$, $Si_5H_5Br_5$, $Si_5H_5Cl_3Br_2$, $Si_6H_6Cl_4$, $Si_6H_8Cl_4$, $Si_5H_6Br_4$ and $Si_5H_6Cl_2Br_2$.

12. A method according to claim 1, wherein the compound (A) is a halo-substituted derivative of a silane containing an alkyl group.

13. A method according to claim 12, wherein the halo-substituted derivative of a silane containing an alkyl group is selected from the group consisting of $SiH_2ClSiH_2Si(CH_3)_3$, $SiH_2BrSi(CH_3)_3$, and $SiH_2OCH_3SiH_2Si(CH_3)_2SiClH_2$.

14. A method according to claim 1, wherein $Si_nX_{2n+2}$ is selected from $SiF_4$, $Si_2F_6$, $Si_3F_8$, $Si_4F_{10}$, $Si_2Cl_6$, $SiF_2Cl_2$, $Si_2F_4Cl_2$ and $SiBr_2F_2$.

15. A method according to claim 1, wherein the active species (a) in $SIF_2^*$.

16. A method according to claim 1, wherein a nitrogen compound is introduced in a gaseous state into the film forming space.

17. A method according to claim 16, wherein the nitrogen compound is selected from the group consisting of $N_2$, $NH_3$, $H_2NNH_2$, $HN_3$ and $NH_4N_3$.

18. A method according to claim 1, wherein there is further introduced into the film forming space at least one of hydrocarbons in a gaseous state selected from the group consisting of saturated hydrocarbons having 1 to 5 carbon atoms, ethylenic hydrocarbons having 2 to 5 carbon atoms and acetylenic hydrocarbons having 2 to 4 carbon atoms.

19. A method according to claim 18, wherein the hydrocarbon is selected from the group consisting of ethane, propane, n-butane, pentane, ethylene, propylene, butene-1, butene-2, isobutylene, pentene, acetylene, methylacetylene and butyne.

20. A method according to claim 1, wherein there is further introduced at least one compound selected from the group consisting of $O_2$, $O_3$, $CO$, $CO_2$, $NO$, $NO_2$ and $N_2O$.

21. A method according to claim 1, wherein there is further introduced into the film forming space a starting material in a gaseous state for introduction of an impurity capable of controlling the electroconductivity characteristics of the deposited film to be formed.

22. A method according to claim 21, wherein the starting material for introduction of an impurity is selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$.

23. A method according to claim 1, wherein the ratio of the amount of the active species (a) to the amount of the compound (A) introduced into the film forming space is in the range from 100:1 to 1:10, in terms of the feeding flow rate ratio.

* * * * *